United States Patent
Ju et al.

(10) Patent No.: US 9,455,255 B2
(45) Date of Patent: Sep. 27, 2016

(54) FIN-TYPE FIELD EFFECT TRANSISTOR AND MANUFACTURING METHOD THEREOF

(71) Applicant: SEMICONDUCTOR MANUFACTURING INTERNATIONAL (SHANGHAI) CORPORATION, Shanghai (CN)

(72) Inventors: JianHua Ju, Shanghai (CN); Shuai Zhang, Shanghai (CN); Shaofeng Yu, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/674,873

(22) Filed: Mar. 31, 2015

(65) Prior Publication Data

US 2015/0311201 A1 Oct. 29, 2015

(30) Foreign Application Priority Data

Apr. 25, 2014 (CN) .......................... 2014 1 0169353

(51) Int. Cl.
*H01L 21/76* (2006.01)
*H01L 27/088* (2006.01)
*H01L 21/8234* (2006.01)
*H01L 21/306* (2006.01)
*H01L 21/308* (2006.01)
*H01L 21/311* (2006.01)
*H01L 21/02* (2006.01)
*H01L 27/092* (2006.01)
*H01L 21/8238* (2006.01)

(52) U.S. Cl.
CPC ....... *H01L 27/0886* (2013.01); *H01L 21/0217* (2013.01); *H01L 21/3081* (2013.01); *H01L 21/3086* (2013.01); *H01L 21/30604* (2013.01); *H01L 21/31111* (2013.01); *H01L 21/823431* (2013.01); *H01L 21/823481* (2013.01); *H01L 21/823493* (2013.01); *H01L 21/823821* (2013.01); *H01L 21/823878* (2013.01); *H01L 21/823892* (2013.01); *H01L 27/0924* (2013.01)

(58) Field of Classification Search
CPC ...................................................... H01L 21/76
See application file for complete search history.

(56) References Cited

U.S. PATENT DOCUMENTS

2015/0171085 A1\* 6/2015 Fumitake ............ H01L 27/0924
257/369

\* cited by examiner

*Primary Examiner* — Marvin Payen
(74) *Attorney, Agent, or Firm* — Innovation Counsel LLP

(57) ABSTRACT

A method of manufacturing a fin-type field effect transistor includes sequentially forming a first mask and a second mask on a semiconductor substrate; patterning the second mask; forming and patterning a third mask on the second mask in accordance with a fin pattern of the fin-type field effect transistor; etching the semiconductor substrate, the first mask, and the second mask through the third mask, wherein portions of the first and second masks are removed and a first trench is formed in the semiconductor substrate; removing the third mask; etching the first mask through the second mask and removing the second mask; etching the semiconductor substrate through the first mask to form a plurality of fins and a second trench disposed between adjacent fins, wherein etching the semiconductor substrate further deepens the first trench such that a depth of the first trench is greater than a depth of the second trench.

10 Claims, 4 Drawing Sheets

FIN-TYPE FIELD EFFECT TRANSISTOR AND MANUFACTURING METHOD THEREOF

CROSS-REFERENCE TO RELATED APPLICATION

This application claims priority to Chinese Patent Application No. 201410169353.4 filed on Apr. 25, 2014, the disclosure of which is incorporated herein by reference in its entirety.

BACKGROUND

1. Technical Field

The present disclosure relates to the field of semiconductor technology, and more particularly to a fin-type field effect transistor and manufacturing method thereof.

2. Description of the Related Art

The transistor is a key component in modern integrated circuits. To meet increasing demands on device speed and performance, the drive current of the transistor needs to increase. Since the drive current is proportional to a gate width of the transistor, it is preferable that the transistor has a larger gate width.

However, the increase in gate width is incompatible with the scaling (reduction) in device size. The fin-type field effect transistor (FinFET) has been developed to address the above problem. In a conventional FinFET manufacturing process, a thin "fin" (or fin member) is formed extending from a substrate. For example, the fin may be formed by etching in a silicon substrate. Specifically, a vertical fin-like member may be formed in a channel of the FinFET. A gate electrode may be provided on the fin-shaped member (e.g., surrounding the fin-shaped member). In some instances, the gate electrode may be disposed on one side of the channel. In other instances, the gate electrode may be disposed on both sides of the channel (which allows the gate to control the channel from both sides of the channel).

FinFET devices have many advantages such as reduced short channel effect and increased current flow. However, to reduce transistor leakage current (or increase isolation between n-type and p-type FinFET device) in existing FinFET devices, the shallow trench isolation in the FinFET devices has to be modified. For example, one effective way is to increase the depth of the shallow trench isolation. However, as fin spacing continues to decrease, it becomes increasingly difficult to control the morphology of the fin-shaped member and the filling of the channel.

Another way to reduce transistor leakage current (or increase isolation between n-type and p-type FinFET device) is to increase the distance between devices. However, the increased device spacing will lead to larger area consumption.

Presently, the shallow trench isolation in FinFET can be improved by increasing the ion implantation dosage in the N-well (NW) and P-well (PW) of the FinFET. Some TOAD simulation results have shown that increasing the ion implantation dosage can increase the breakdown voltage (BVD) in the N+/NW and P+/PW. However, if the ion implantation dosage is greater than $10^{14}/cm^2$, problems such as low resistance (Rs), increase in junction leakage current, and high junction capacitance may occur.

SUMMARY

The present disclosure addresses at least the above issues in existing FinFET devices.

According to one embodiment of the inventive concept, a method of manufacturing a fin-type field effect transistor is provided. The method includes: sequentially forming a first mask and a second mask on a semiconductor substrate; patterning the second mask; forming a third mask on the second mask, and patterning the third mask in accordance with a fin pattern of the fin-type field effect transistor; etching the semiconductor substrate, the first mask, and the second mask through the third mask, wherein a first trench is formed in the semiconductor substrate; removing the third mask; etching the first mask through the second mask, and subsequently removing the second mask; etching the semiconductor substrate through the first mask to form a plurality of fins and a second trench disposed between adjacent fins, wherein the etching of the semiconductor substrate further deepens the first trench such that a depth of the first trench is greater than a depth of the second trench; and forming the fin-type field effect transistor on the semiconductor substrate, wherein a dielectric material is disposed in the first trench and the second trench.

In some embodiments, the semiconductor substrate may be a p-type silicon substrate having a <100> crystal orientation.

In some embodiments, the first mask may be a hard mask layer.

In some embodiments, the first mask may include silicon nitride.

In some embodiments, the second mask may be a hard mask layer.

In some embodiments, the third mask may be a photoresist layer.

In some embodiments, the depth of the first trench may be controlled depending on a thickness of the first mask, and an etch rate, etch selectivity, and etching time of each of the first mask and the semiconductor substrate.

In some embodiments, the fin-type field effect transistor may include an N-well and a P-well formed in the semiconductor substrate, and wherein a common boundary between the N-well and the P-well may lie directly below a center bottommost portion of the first trench.

In some embodiments, forming the fin-type field effect transistor may further include forming an N-well and a P-well in the semiconductor substrate through ion implantation, and an energy of the ion implantation may range from about 25 KeV to about 180 KeV.

In some embodiments, forming the fin-type field effect transistor may further include forming an N-well and a P-well in the semiconductor substrate through ion implantation, and a dosage of the ion implantation may be less than about $10^{14}/cm^2$.

According to another embodiment of the inventive concept, a semiconductor device is provided. The semiconductor device includes a plurality of fin-type field effect transistors, wherein the fin-type field effect transistors are isolated from each other by a first trench, wherein adjacent fins within each fin-type field effect transistor are separated from each other by a second trench, and wherein a depth of the first trench is greater than a depth of the second trench.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
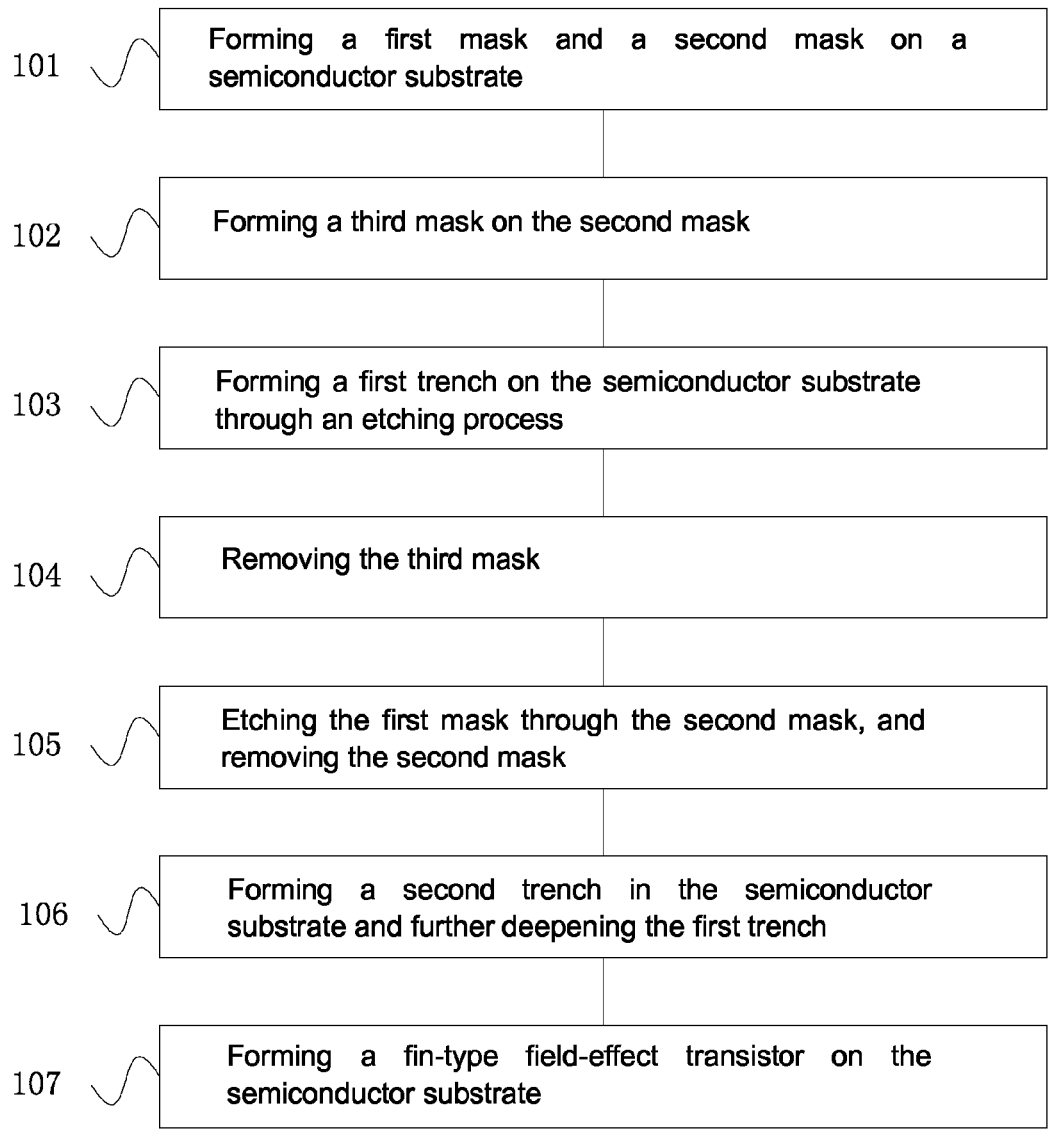
FIG. 1 is a flowchart illustrating an exemplary method of manufacturing a fin-type field-effect transistor according to an embodiment of the inventive concept.

Various embodiments of the inventive concept are next described with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that the inventive concept is not limited to the embodiments described herein. Rather, the inventive concept may be modified in different ways to realize different embodiments.

FIG. 1 is a flowchart illustrating an exemplary method of manufacturing a fin-type field-effect transistor according to an embodiment of the inventive concept. The steps in the exemplary method will be described with reference to FIGS. 2A-2I which depict schematic cross-sectional views of the fin-type field-effect transistor at different stages of manufacture.

Figure 2A:
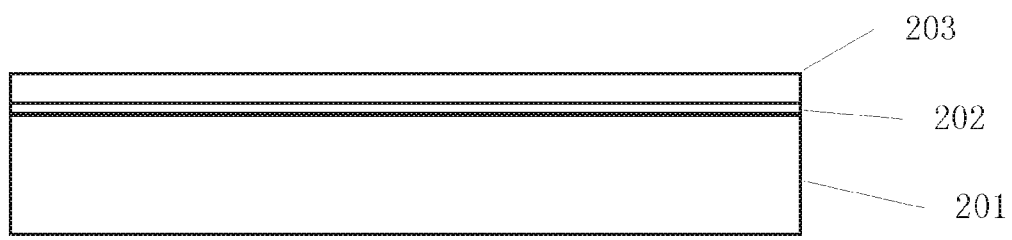
FIGS. 2A-2I are schematic cross-sectional views of the fin-type field-effect transistor of FIG. 1 at different stages of manufacture.

Referring to FIG. 2A, a first mask 202 and a second mask 203 are formed on a semiconductor substrate 201 (Step 101).

The semiconductor substrate 201 may include a bulk silicon substrate (either doped or undoped) or a silicon-on-insulator (SOI) substrate having an active layer. The SOI substrate typically comprises a layer of semiconductor material (such as silicon, germanium, silicon germanium, SOI, silicon germanium-on-insulator (SGOI), or a combination thereof). Other substrates may also be used for the semiconductor substrate 201, such as a multilayer substrate, a substrate having a doped gradient profile, a hybrid substrate, and the like. In one embodiment, the semiconductor substrate 201 is a p-type silicon substrate having a <100> crystal orientation.

The semiconductor substrate 201 may further include various doping regions and other devices (which may not be illustrated in the drawings to avoid obscuring the inventive concept).

The first mask 202 and the second mask 203 may be formed of different hard mask materials. For example, the first mask 202 may be formed of silicon nitride (SiN) and the second mask 203 may be formed of silicon dioxide. As a result, the first mask 202 and the second mask 203 may be separately etched during subsequent process steps.

Figure 2B:
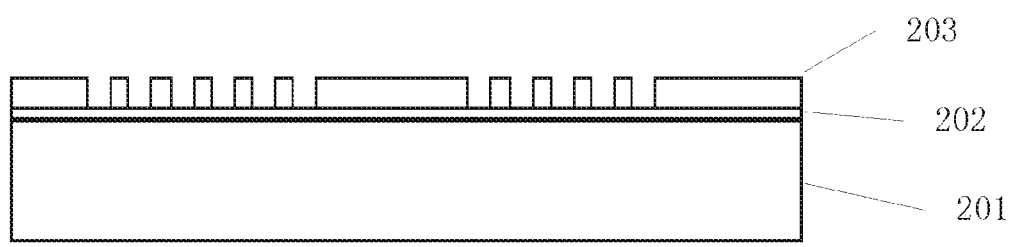

Next, the second mask 203 is patterned in accordance with a fin pattern of the fin-type field-effect transistor, as shown in FIG. 2B. In particular, the pattern of the second mask 203 corresponds to the respective fin positions of the fin-type field-effect transistor.

Figure 2C:
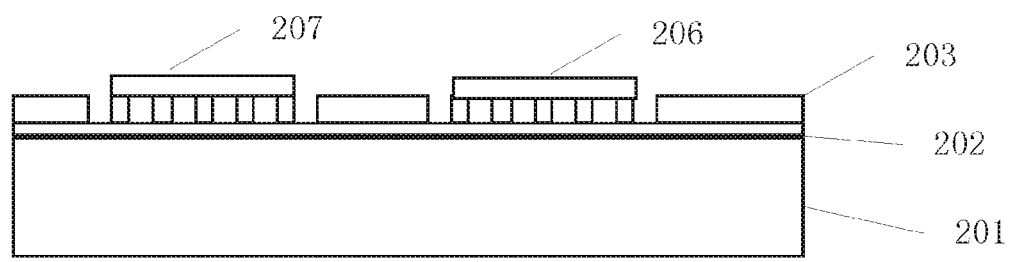
Figure 2D:
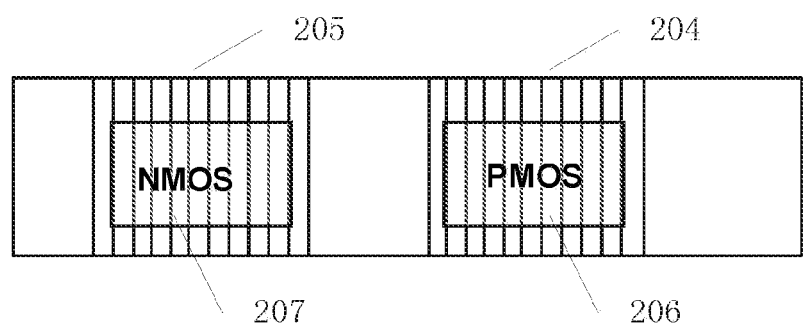

Next, a third mask is formed on the patterned second mask 203 (Step 102). The third mask may be formed of, for example, a photoresist. The third mask may be patterned using photolithography (including exposure, development, and other processes). FIGS. 2C and 2D respectively depict a cross-sectional view and a plan view of the resulting structure after the third mask has been patterned. As shown in FIGS. 2C and 2D, the patterned third mask includes third mask patterns 206 and 207. Specifically, the third mask pattern 206 is disposed over an area corresponding to a (yet-to-be-formed) PMOS region, and the third mask pattern 207 is disposed over an area corresponding to a (yet-to-be-formed) NMOS region.

Next, the patterned second mask 203, the first mask 202, and the semiconductor substrate 201 are etched through the patterned third mask (i.e. the third mask patterns 206/207), whereby portions of the first and second masks 202/203 are removed and a first trench 208 is formed in the semiconductor substrate 201 (Step 103). The aforementioned etching process may proceed as follows. For example, depending on the materials used in the second mask 203, first mask 202, and semiconductor substrate 201, a first etching solution may be used to etch the patterned second mask 203. After the patterned second mask 203 has been etched, a second etching solution may be used to etch the first mask 202. Finally, after the first mask 202 has been etched, a third etching solution may be used to etch the semiconductor substrate 201. Nevertheless, those skilled in the art would recognize that in some other embodiments, the etching process may include only one or two types of etchant to etch the first/second masks 202/203 and the semiconductor substrate 201. The etching process may include various etching methods such as dry etching, wet etching, or a combination of dry etching and wet etching. For example, dry etching may include the use of fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or BCl3), bromine-containing gas (e.g., HBr and/or $CHBR_3$), oxygen-containing gas, iodine gas, and any other gas or plasma that can be used for dry etching.

Figure 2E:
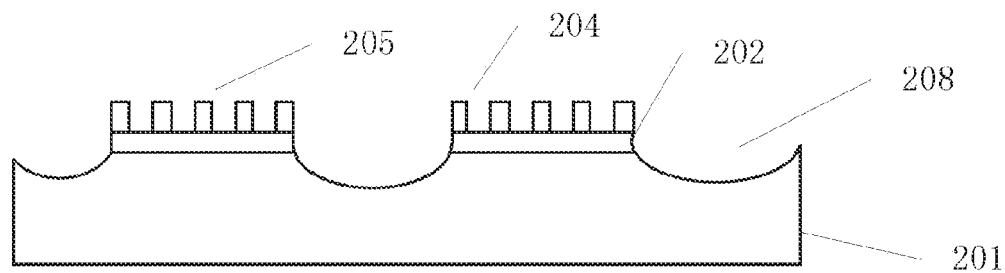

Next, the patterned third mask (i.e. the third mask patterns 206/207) is removed (Step 104). FIG. 2E depicts a cross-sectional view of the resulting structure after the patterned third mask has been removed. As shown in FIG. 2E, the portions of the semiconductor substrate 201, first mask 202, and second mask 203 (that were previously protected by the third mask patterns 206/207) remain. Conversely, the portions of the semiconductor substrate 201, first mask 202, and second mask 203 (that were not previously protected by the third mask patterns 206/207) are etched such that the first trench 208 is formed in the semiconductor substrate 201. The depth of the first trench 208 can be controlled depending on the etching time, thickness of the first mask 202, the etch rates of the first mask 202 and semiconductor substrate 201, and the etch rate selectivity of the etchant(s).

Figure 2F:
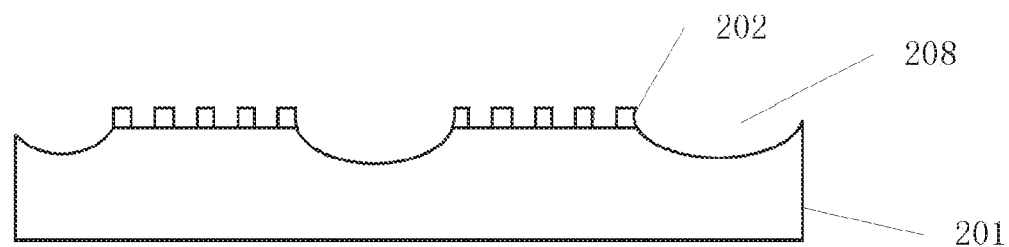

Next, the first mask 202 is etched through the patterned second mask 203 so as to transfer the fin pattern of the fin-type field-effect transistor to the first mask 202, after which the patterned second mask 203 is then removed (Step 105). As shown in FIG. 2F, only the patterned first mask 202 remains on the semiconductor substrate 201 after Step 105.

Figure 2G:
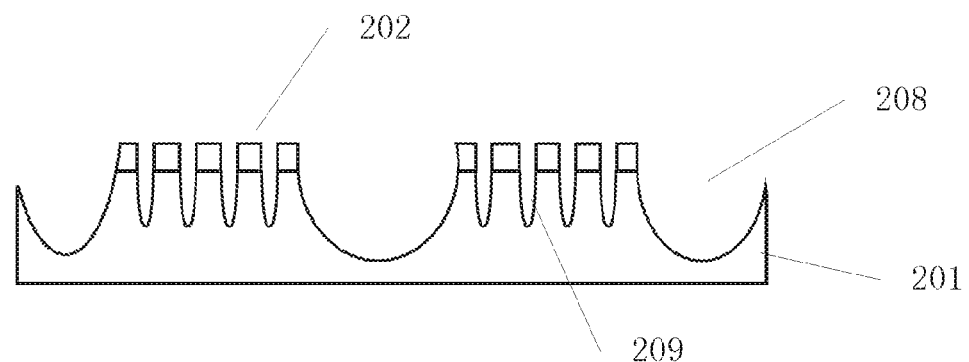

Next, the semiconductor substrate 201 is etched through the patterned first mask 202 so as to form a second trench 209 and further deepen the first trench 208 (Step 106). As shown in FIG. 2G, significant portions of the semiconductor substrate 201 are etched in Step 106. Specifically, the portion of the semiconductor substrate 201 directly beneath the patterned first mask 202 is etched to form the second trench 209, whereas the depth of the previously-formed first trench 208 is further increased by the etch.

Finally, the structure of FIG. 2G undergoes further processing to form the fin-type field-effect transistor on the semiconductor substrate 201 (Step 107).

Figure 2H:
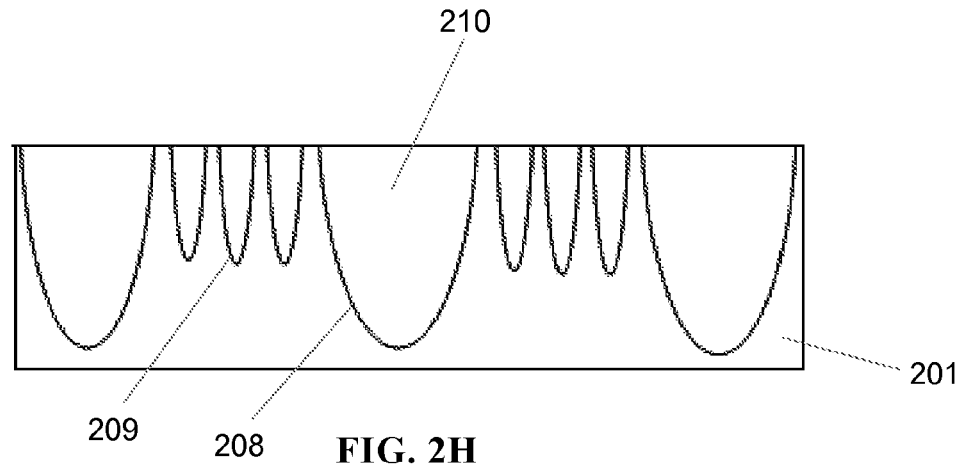

In one embodiment (for example, as shown in FIG. 2H), after the first mask 202 has been removed, a dielectric material 210 is deposited on the semiconductor substrate 201 so as to fill the first trench 208 and the second trench 209. Next, a chemical mechanical polishing (CMP) process is performed to produce the planarized structure illustrated in FIG. 2H. The dielectric material 210 may be, for example, silicon oxide, silicon nitride, silicon oxynitride, a polymer, or any other suitable dielectric material. The dielectric material 210 may be deposited using, for example, flowable chemical vapor deposition (FCVD) methods.

Figure 2I:
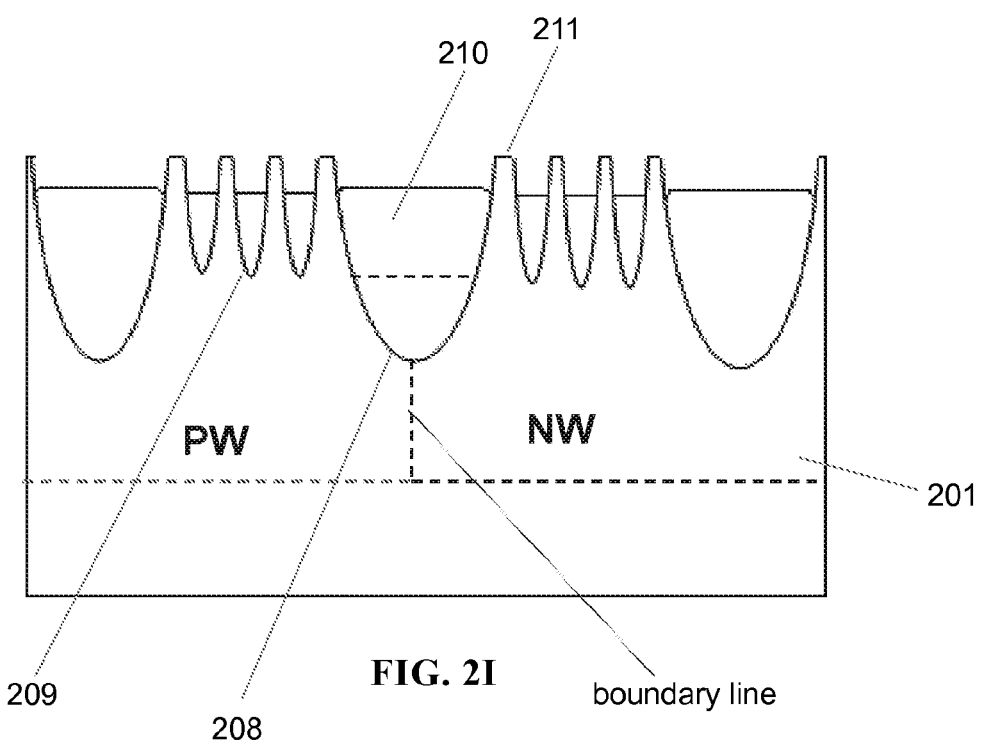

Next, the dielectric material 210 may be etched back to expose fins 211 (as shown in FIG. 2I). In one embodiment, a height of the fin 211 may range from about 30 nm to about 60 nm. Referring to FIG. 2I, in a preferred embodiment, a P-well (PW) and an N-well (NW) are formed in the semiconductor substrate 201, and a common boundary between the P-well and the N-well may lie directly below the center (bottommost portion) of a first trench 208 disposed between the P-well and the N-well.

The P-well and the N-well may be formed by ion implantation. It is noted that the ion implantation energy requirements in the above embodiment may be higher than the typical ion implantation energy required to form a conventional FinFET. For example, in one preferred embodiment, the ion implantation energy may range from about 25 KeV to about 180 KeV. However, the ion implantation dosage for the above embodiment can be controlled to about $10^{13}/cm^2$, which is less than the typical ion implantation dosage ($10^{14}/cm^2$) to form a conventional FinFET.

Since the subsequent process steps for forming the FinFET are known to those skilled in the art, a description of those subsequent process steps shall be omitted.

According to an embodiment of the inventive concept, FinFETs are formed having different shallow trench isolation different depths, whereby the FinFETs are isolated from each other by a first trench (e.g. first trench 208), whereby adjacent fins within each FinFET are separated from each other by a second trench (e.g. second trench 209), and whereby a depth of the first trench is greater than a depth of the second trench. Thus, the depth of the interval between the shallow trench isolation can be increased, thereby improving the leakage current or (breakdown) voltage characteristics between different devices.

Embodiments of a semiconductor device and methods of manufacturing the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A method of manufacturing a fin-type field effect transistor, comprising:
    sequentially forming a first mask and a second mask on a semiconductor substrate;
    patterning the second mask;
    forming a third mask on the second mask, and patterning the third mask in accordance with a fin pattern of the fin-type field effect transistor;
    etching the semiconductor substrate, the first mask, and the second mask through the third mask, wherein a first trench is formed in the semiconductor substrate;
    removing the third mask;
    etching the first mask through the second mask, and subsequently removing the second mask;
    etching the semiconductor substrate through the first mask to form a plurality of fins and a second trench disposed between adjacent fins, wherein the etching of the semiconductor substrate further deepens the first trench such that a depth of the first trench is greater than a depth of the second trench; and
    forming the fin-type field effect transistor on the semiconductor substrate, wherein a dielectric material is disposed in the first trench and the second trench.

2. The method according to claim 1, wherein the semiconductor substrate is a p-type silicon substrate having a <100> crystal orientation.

3. The method according to claim 1, wherein the first mask is a hard mask layer.

4. The method according to claim 3, wherein the first mask includes silicon nitride.

5. The method according to claim 1, wherein the second mask is a hard mask layer.

6. The method according to claim 1, wherein the third mask is a photoresist layer.

7. The method according to claim 1, wherein the depth of the first trench is controlled depending on a thickness of the first mask, and an etch rate, etch selectivity, and etching time of each of the first mask and the semiconductor substrate.

8. The method according to claim 1, wherein the fin-type field effect transistor includes an N-well and a P-well formed in the semiconductor substrate, and wherein a common boundary between the N-well and the P-well lies directly below a center bottommost portion of the first trench.

9. The method according to claim 1, wherein forming the fin-type field effect transistor further comprises forming an N-well and a P-well in the semiconductor substrate through ion implantation, and an energy of the ion implantation ranges from about 25 KeV to about 180 KeV.

10. The method according to claim 1, wherein forming the fin-type field effect transistor further comprises forming an N-well and a P-well in the semiconductor substrate through ion implantation, and a dosage of the ion implantation is less than about $10^{14}/cm^2$.

* * * * *